US009905567B2

(12) United States Patent
Kim

(10) Patent No.: US 9,905,567 B2
(45) Date of Patent: Feb. 27, 2018

(54) SEMICONDUCTOR INTEGRATED CIRCUIT DEVICE RELATING TO RESISTANCE CHARACTERISTICS

(71) Applicant: SK hynix Inc., Icheon-si, Gyeonggi-do (KR)

(72) Inventor: Jin Ha Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/295,042

(22) Filed: Oct. 17, 2016

(65) Prior Publication Data

US 2017/0358591 A1 Dec. 14, 2017

(30) Foreign Application Priority Data

Jun. 8, 2016 (KR) ........................ 10-2016-0070952

(51) Int. Cl.
| | |
|---|---|
| *H01L 29/76* | (2006.01) |
| *H01L 31/036* | (2006.01) |
| *H01L 27/11568* | (2017.01) |
| *H01L 29/792* | (2006.01) |
| *H01L 29/423* | (2006.01) |
| *H01L 27/11582* | (2017.01) |
| *H01L 27/1157* | (2017.01) |
| *H01L 27/11556* | (2017.01) |
| *H01L 27/11551* | (2017.01) |
| *H01L 27/11578* | (2017.01) |
| *H01L 29/04* | (2006.01) |

(52) U.S. Cl.
CPC .... *H01L 27/11568* (2013.01); *H01L 27/1157* (2013.01); *H01L 27/11551* (2013.01); *H01L 27/11556* (2013.01); *H01L 27/11578* (2013.01); *H01L 27/11582* (2013.01); *H01L 29/04* (2013.01); *H01L 29/4234* (2013.01); *H01L 29/792* (2013.01); *H01L 29/7926* (2013.01)

(58) Field of Classification Search
CPC .......... H01L 27/11568; H01L 29/4234; H01L 29/792; H01L 27/11582; H01L 27/11556; H01L 27/1157; H01L 27/11578; H01L 27/11551; H01L 29/04; H01L 29/7926
USPC ............................................ 257/314, 66, 69
See application file for complete search history.

(56) References Cited

U.S. PATENT DOCUMENTS

| | | | | |
|---|---|---|---|---|
| 9,716,104 B2* | 7/2017 | Kim | ................. | H01L 27/11582 |
| 2011/0291172 A1* | 12/2011 | Hwang | ............. | H01L 27/11578 257/314 |
| 2015/0263029 A1* | 9/2015 | Kim | ................. | H01L 27/11575 257/314 |

(Continued)

FOREIGN PATENT DOCUMENTS

| | | |
|---|---|---|
| KR | 1020070038629 A | 4/2007 |
| KR | 1020130086778 A | 8/2013 |

*Primary Examiner* — Shouxiang Hu
(74) *Attorney, Agent, or Firm* — William Park & Associates Ltd.

(57) ABSTRACT

A semiconductor integrated circuit device may include a structure, a first capping layer, a channel layer and a second capping layer. The structure may have an opening formed in the structure. The first capping layer may be formed in the opening of the structure. The channel layer may be arranged between the structure and the first capping layer. The second capping layer may be arranged on the channel layer and the first capping layer.

10 Claims, 7 Drawing Sheets

(56) References Cited

U.S. PATENT DOCUMENTS

2016/0268264 A1* 9/2016 Hwang ............. H01L 27/11578
2016/0268302 A1* 9/2016 Lee ................... H01L 27/11582

* cited by examiner

SEMICONDUCTOR INTEGRATED CIRCUIT DEVICE RELATING TO RESISTANCE CHARACTERISTICS

CROSS-REFERENCES TO RELATED APPLICATION

The present application claims priority under 35 U.S.C. § 119(a) to Korean application number 10-2016-0070952, filed on Jun. 8, 2016, in the Korean Intellectual Property Office, which is incorporated herein by reference in its entirety.

BACKGROUND

1. Technical Field

Various embodiments may generally relate to a semiconductor integrated circuit device and a method of manufacturing the same, more particularly, to a semiconductor integrated circuit device relating to a resistance characteristic and a method of manufacturing the semiconductor integrated circuit device.

2. Related Art

A non-volatile memory device may maintain stored data even though power may not be supplied to the non-volatile memory device. The non-volatile memory device may consist of a memory cell configured to store the data. The memory cell may consist of a tunnel insulating layer, a floating gate, a charge-blocking layer and a control gate electrode sequentially stacked.

In order to provide a semiconductor integrated circuit device with a high integration degree, the memory cells may have a three-dimensional structure. The three-dimensional memory cells is connected with conductive patterns positioned on different planes. The conductive patterns may be stacked in a stepped shape.

As stacked numbers of the memory cells increase, it is important to secure a cell current. In order to secure the cell current, it may be required to reduce a contact resistance between a channel region and a bit line region.

SUMMARY

According to an embodiment, there may be provided a semiconductor integrated circuit device. The semiconductor integrated circuit device may include a structure, a first capping layer, a channel layer and a second capping layer. The structure may have an opening formed in the structure. The first capping layer may be formed in the opening of the structure. The channel layer may be arranged between the structure and the first capping layer. The second capping layer may be arranged on the channel layer and the first capping layer.

According to an embodiment, there may be provided a method of manufacturing a semiconductor integrated circuit device.

DETAILED DESCRIPTION

Figure 1:
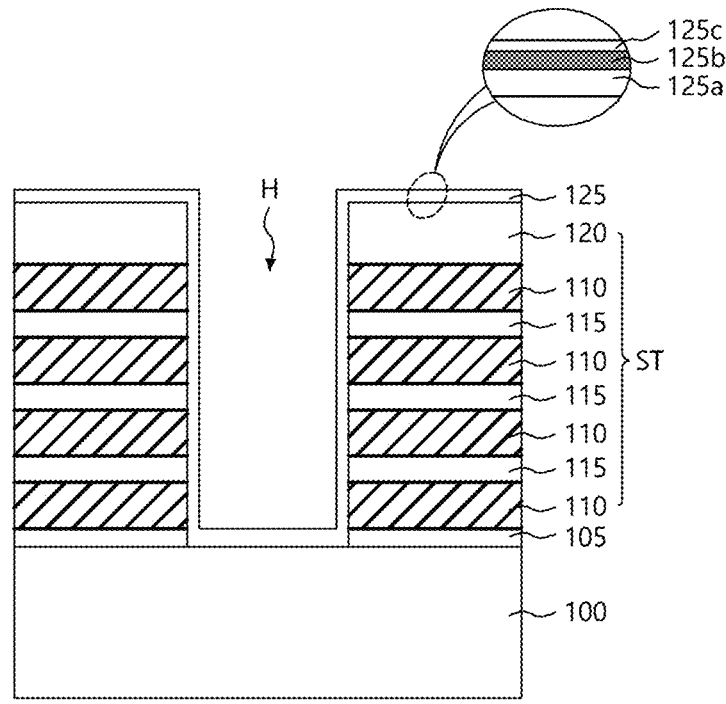
FIGS. 1 to 8 are cross sectional views illustrating a representation of a method of manufacturing a semiconductor integrated circuit device in accordance with examples of embodiments.

Various examples of embodiments will be described hereinafter with reference to the accompanying drawings, in which some examples of the embodiments are illustrated. The embodiments may, however, be embodied in many different forms and should not be construed as limited to the examples of embodiments set forth herein. Rather, these examples of embodiments are provided so that this disclosure will be thorough and complete, and will fully convey a scope of the present disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "under" other elements or features would then be oriented "above" the other elements or features. Thus, the example of the term "below" can encompass both an orientation of above and below. The device may be otherwise oriented (rotated 90 degrees or at other orientations) and the spatially relative descriptors used herein interpreted accordingly.

The terminology used herein is for the purpose of describing particular examples of embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, examples of the embodiments will be explained with reference to the accompanying drawings.

FIGS. 1 to 8 are cross sectional views illustrating a representation of a method of manufacturing a semiconductor integrated circuit device in accordance with examples of embodiments.

Referring to FIG. 1, a pad insulating layer 105 may be formed on an upper surface of a semiconductor substrate 100. A stack structure ST may be formed on an upper surface of the pad insulating layer 105. The stack structure ST may include conductive layers 110 and insulating layers 115 alternately stacked. The conductive layers 110 may be used as a gate of a selection transistor and a memory cell transistor in a stack memory device. Alternatively, the conductive patterns 110 may be arranged between the two insulating layers 115. An uppermost insulating layer 120 among the insulating layers 110 and 115 may have a thickness greater than a thickness of other insulating layers 110 and 115.

The stack structure ST may be etched to form an opening H configured to expose the upper surface of the semiconductor substrate 100. The opening H may have a circular cross-sectional shape, an elliptical cross-sectional shape, a quadrilateral cross-sectional shape, etc. The opening H may have an upper diameter and a lower diameter substantially the same as the upper diameter. Alternatively, the opening H may have a gradually decreased diameter from an upper end to a lower end of the opening H due to a height of the stack structure ST. A memory layer 125 may be formed on the stack structure ST having the opening H. The memory layer 125 may include a blocking layer 125a, a charge-trapping layer 125b and tunnel insulating layer 125c sequentially stacked. The memory layer 125 may be used as a gate insulating layer of the selection transistor. The memory layer 125 may be used as a data storing layer of the memory cell transistor. The charge-trapping layer 125b configured to substantially store data may include a material such as silicon, nitride, phase-changeable materials, etc.

Figure 2:
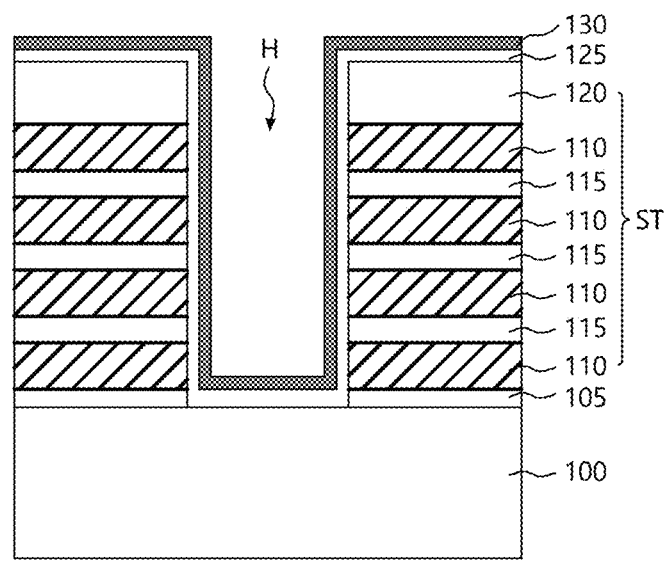

Referring to FIG. 2, a channel layer 130 may be formed on the memory layer 125. The channel layer 130 may have a uniform thickness. The channel layer 130 may include a semiconductor material. Particularly, the channel layer 130 may include polysilicon having a first grain size. The polysilicon of the channel layer 130 may include conductive impurities. The channel layer 130 may be formed by a chemical vapor deposition (CVD) process.

Figure 3:
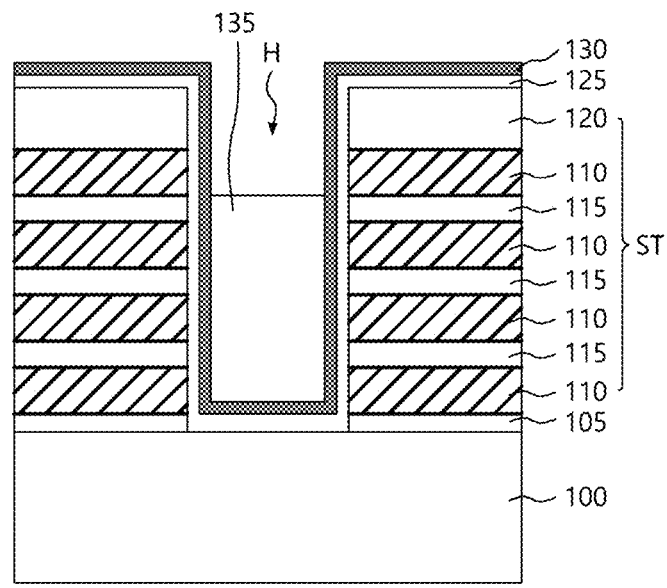

Referring to FIG. 3, a filling material may be formed in the opening H. The filling material may include an insulating material. For example, the filling material may include polisilazane (PSG) formed by a spin process. The filling material may be partially removed to form a core pattern 135 in the opening H. The core pattern 135 may have a height less than a height of the opening H.

Figure 4:
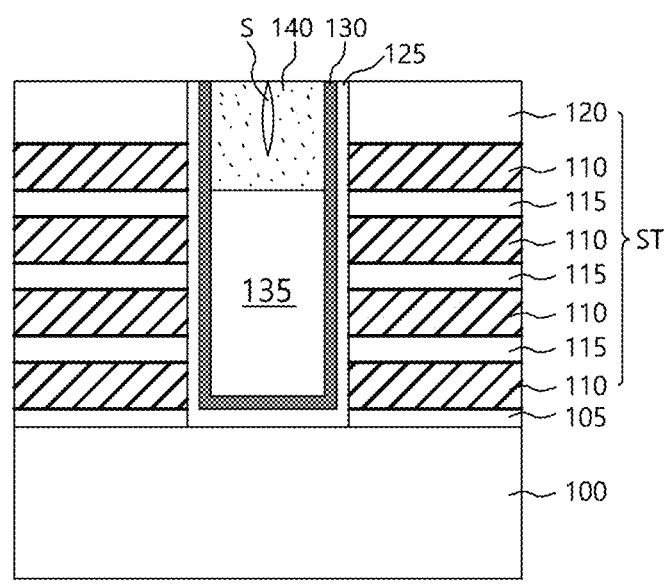

Referring to FIG. 4, a semiconductor material may be formed on the core pattern 135 to fill up the opening H with the semiconductor material. The semiconductor material may be substantially the same as a material of the channel layer 130. The semiconductor material may have a grain size different from a grain size of the channel layer 130. In examples of the embodiments, the semiconductor material may have a second grain size smaller than the first grain size. The semiconductor material may include polysilicon. The semiconductor material may have an impurity concentration higher than an impurity concentration of the channel layer 130. For example, the impurity concentration of the semiconductor material may be $2E^{20}n/cm^3$ to $4E^{20}n/cm^3$.

The semiconductor material such as silicon or polysilicon may be deposited in the opening H using a furnace. The deposition process using the furnace may be performed at a temperature of about 500° C. to about 550° C. The doped polysilicon formed by the furnace may have a grain size smaller than a grain size of a doped polysilicon formed by an ALD process or a CVD process.

The semiconductor material may be planarized until an upper surface of the stack structure ST may be exposed to form a first capping layer 140. A reference numeral 's' may indicate a seam remaining in the first capping layer 140.

Here, a specific resistance of a material may be increased proportional to decreasing a grain size of the material. Thus, the first capping layer 140 may have a specific resistance relatively higher than a specific resistance of the channel layer 130.

Because the first capping layer 140 may include the impurities having a concentration higher than that of the impurities in the channel layer 130, the first capping layer 140 may have improved conductive characteristics relatively compared to the channel layer 130. That is, a contact resistance between the channel layer 130 having the low impurity concentration and a metal wiring may be higher than a contact resistance between the first capping layer 140 and the metal wiring. Because a bit line or a wiring connected to a bit line may make contact with a channel layer and a first capping layer, a contact resistance of a contact portion of the channel layer may be increased.

Further, because the seam s may be generated in the first capping layer 140 formed by the furnace, the seam s may increase the resistance. As a result, above-mentioned problems may cause a high wiring resistance of a semiconductor integrated circuit device.

Figure 5:
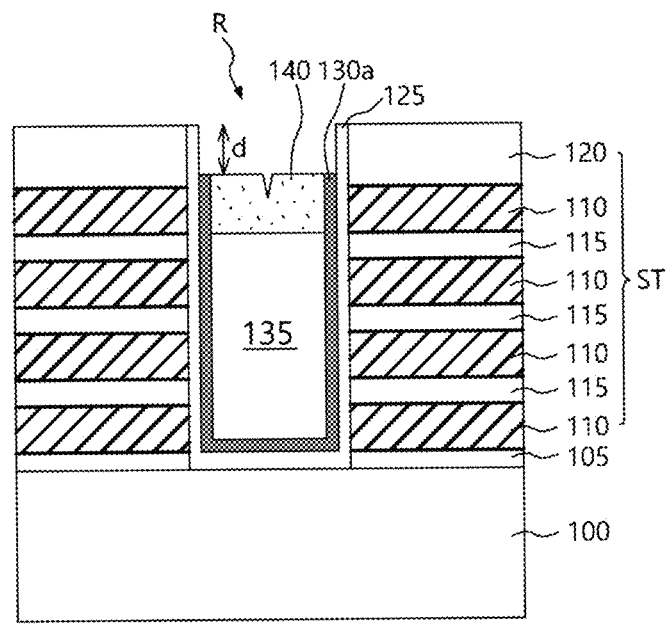
Figure 6:
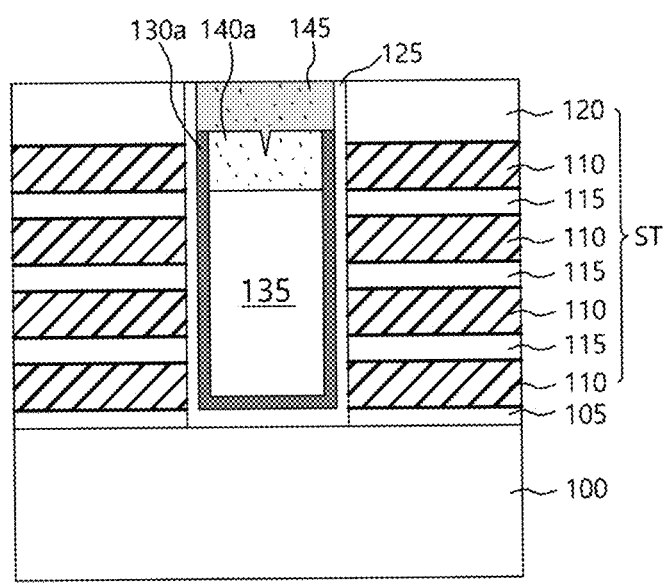

In order to improve the above-mentioned problems in the examples of the embodiments, referring to FIG. 5, the first capping layer 140 may be etched-back to form a second capping layer 145 (i.e., see FIG. 6). The second capping layer 145 may function as a contact pad layer. A recess R may be formed over the first capping layer 140a by the etch-back process. The recess R may have a depth 'd' of 50 Å to 100 Å. That is, the depth of the recess may correspond to the Referring to FIG. 6, the second capping layer 145 may grow in the recess R using the first capping layer 140 and the channel layer 130a (see FIG. 5) as a seed layer. The second capping layer 145 may be formed by a selective polysilicon growth process or a selective epitaxial growth process. The selective polysilicon growth process may be performed at a temperature of about 500° C. to about 700° C. under a pressure of about 10 torr to about 30 torr using about 150 sccm to about 200 sccm of an $SiH_4$ gas and about 10 sccm to about 20 sccm of an HCl gas. Because the second capping layer 145 may be formed by the growth process, the impurities in the first capping layer 140a may be diffused into the second capping layer 145. Additionally, in order to provide the second capping layer 145 with a function of the contact pad layer, an impurity doping process or an ion implantation process may be performed on the second capping layer 145 (see FIG. 7).

Figure 7:
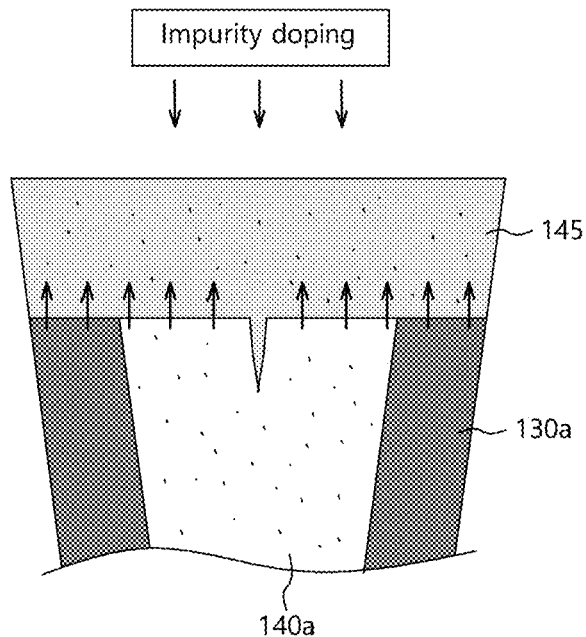

Referring to FIG. 7, the second capping layer 145 may use the first capping layer 140a having the second grain size and the channel layer 130a having the first grain size. Thus, a crystallization of the channel layer 130a having the relatively larger grain size may be provided to the second capping layer 145 so that the second capping layer 145 may have a grain size larger than the second grain size. As a result, the grain size of the second capping layer 145 may be different from the grain sizes of the first capping layer 140a and the channel layer 130a so that the second capping layer 145 may have a specific resistance lower than a specific resistance of the first capping layer 140a. That is, the grain size of the second capping layer 145 is larger than that of the first capping layer 140a and is smaller than that of the channel layer 130a. In other words, a resistance of the second capping is lower than that of the first capping layer 140a and is greater than that of the channel layer 130a.

Further, the second capping layer 145 as the contact pad layer may be configured to cover the first capping layer 140a and the channel layer 130a. Therefore, a metal wiring such as a silicide layer may directly make contact with the second capping layer 145, not the channel layer 130a. As a result, the semiconductor integrated circuit device may have improved contact resistance.

Because the second capping layer 145 may be formed by the growth process, the second capping layer 145 in the recess R may not have the seam. Thus, a high contact resistance caused by the seam may be prevented.

Figure 8:
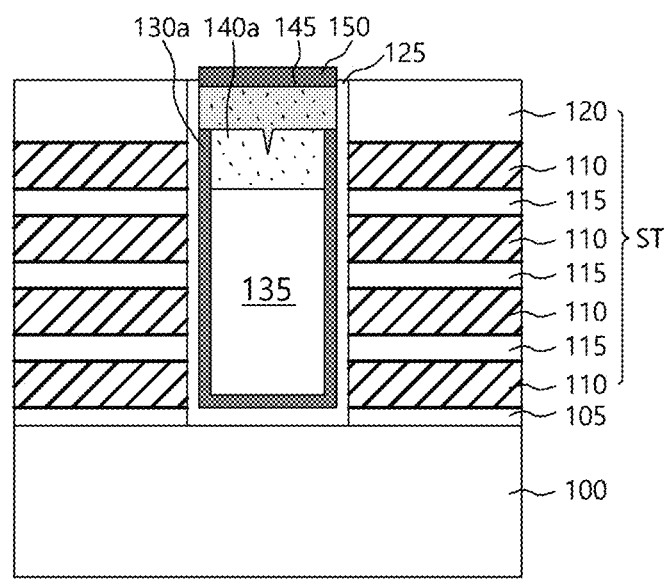

Referring to FIG. 8, a transition metal layer may be formed on the stack structure ST and the second capping layer 145. The transition metal layer may be thermally treated to form a silicide layer 150 on the second capping layer 145. A residue of the transition metal layer may then be removed.

Figure 9:
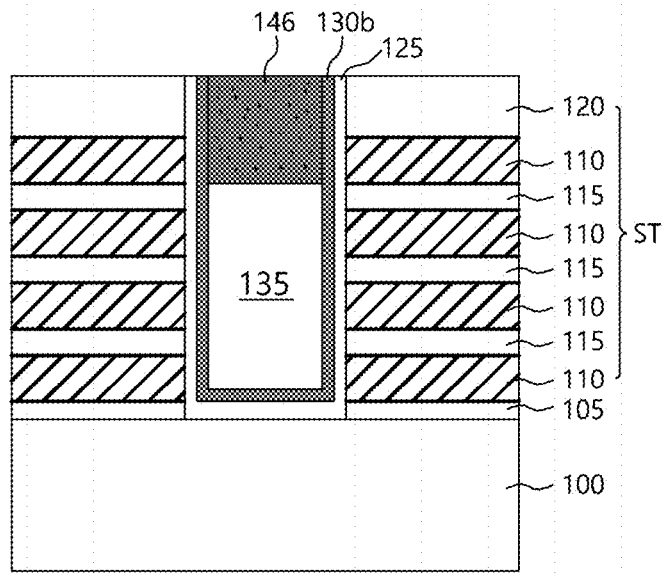
FIG. 9 is a cross sectional view illustrating a representation of a semiconductor integrated circuit device in accordance with examples of embodiments.

FIG. 9 is a cross sectional view illustrating a representation of a semiconductor integrated circuit device in accordance with examples of embodiments.

Referring to FIG. 9, a first capping layer 146 may be formed by a selective polysilicon growth process or a selective epitaxial growth process in place of the furnace process.

In examples of the embodiments, the concepts of the present description may be applied to a stack structure of a non-volatile memory device. Alternatively, the concepts may be applied to contact structures, for example, as illustrated in FIGS. 10 and 11.

Figure 10:
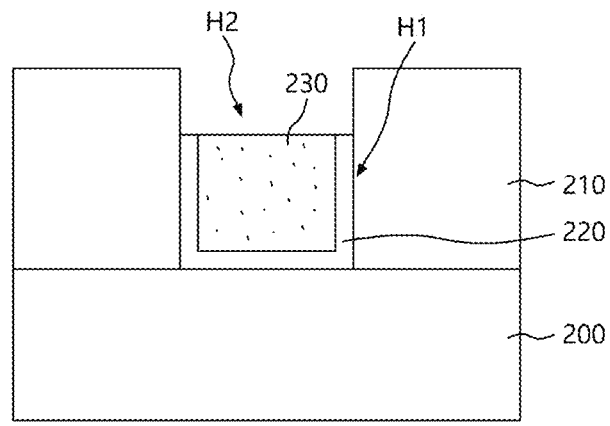
FIGS. 10 and 11 are cross sectional views illustrating a representation of a method of manufacturing a semiconductor integrated circuit device in accordance with examples of embodiments.
Figure 11:
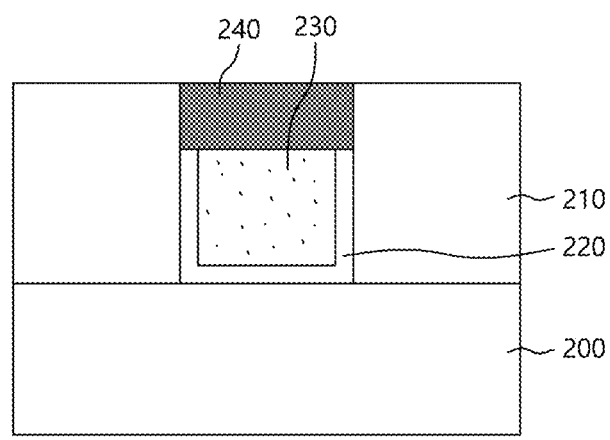

FIGS. 10 and 11 are cross sectional views illustrating a representation of a method of manufacturing a semiconductor integrated circuit device in accordance with examples of embodiments.

Referring to FIG. 10, an insulating interlayer 210 may be formed on a semiconductor substrate 200. The insulating interlayer 210 may be etched to form a contact hole H1.

A first layer 220 may be formed on an inner surface of the contact hole H1. The first layer 220 may have a uniform thickness. The first layer 220 may include a semiconductor material having a first grain size. A second layer 230 may be formed on the first layer 220 to fill up the contact hole H1. The second layer 230 may have a second grain size smaller than the first grain size. The second layer 230 may include a semiconductor material substantially the same as the semiconductor material of the first layer 220. The first layer 220 and the second layer 230 may be etched-back to form a recess H2 in the contact hole H1.

Referring to FIG. 11, a contact pad layer 240 may be formed on the first and second layers 220 and 230 using the first and second layers 220 and 230 as a seed layer to fill up the recess H2.

According to examples of embodiments, the contact pad layer or the second capping layer configured to directly make contact with the metal wiring or the silicide layer may receive the crystallization of the channel layer and the first capping layer so that the specific resistance of the contact pad layer may be improved. Further, the channel layer having the relatively low impurity region may not directly make contact with the metal wiring so that the contact resistance may be improved.

Figure 12:
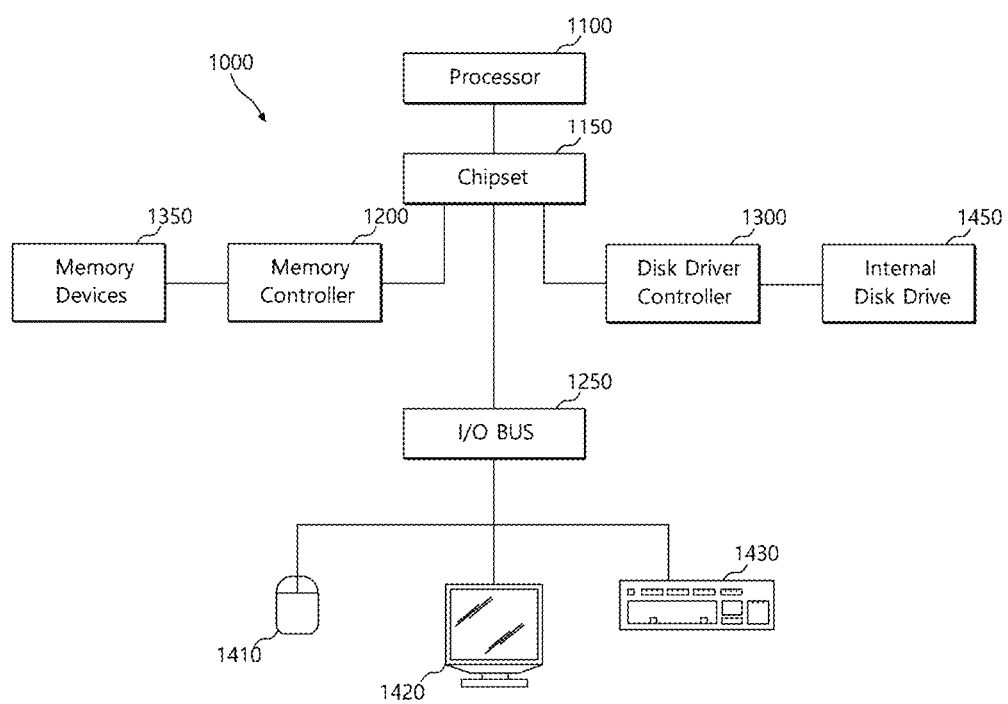
FIG. 12 illustrates a block diagram of an example of a representation of a system employing a semiconductor integrated circuit device and or method with the various embodiments discussed above with relation to FIGS. 1-11.

The semiconductor integrated circuit devices and or methods as discussed above (see FIGS. 1-11) are particular useful in the design of other memory devices, processors, and computer systems. For example, referring to FIG. 12, a block diagram of a system employing a semiconductor integrated circuit device and or method in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor integrated circuit device and or employ a method as discussed above with reference to FIGS. 1-11. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor integrated circuit device and or employ a method as discussed above with relation to FIGS. 1-11, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 12 is merely one example of a semiconductor integrated circuit device and or employing a method as discussed above with relation to FIGS. 1-11. In alternate embodiments, such as, for example but not limited to, cellular phones or digital cameras, the components may differ from the embodiments illustrated in FIG. 12.

The above embodiments of the present disclosure are illustrative and not limitative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:

1. A semiconductor integrated circuit device comprising:
   a stack structure including conductive layers and insulating layers alternately stacked, the stack structure having an opening;
   a first capping layer formed in the opening;
   a channel layer interposed between the stack structure and the first capping layer; and
   a second capping layer formed in the opening on the channel layer and the first capping layer,
   wherein the second capping layer is configured to be simultaneously contacted with the channel layer and the first capping layer, and the channel layer is formed to surround a sidewall of the first capping layer.

2. The semiconductor integrated circuit device of claim 1, wherein the first capping layer has an upper surface lower than an upper surface of the stack structure.

3. The semiconductor integrated circuit device of claim 1, wherein the second capping layer has an upper surface substantially coplanar with an upper surface of the stack structure.

4. The semiconductor integrated circuit device of claim 1, wherein the channel layer, the first capping layer and the second capping layer comprises polysilicon.

5. The semiconductor integrated circuit device of claim 1, wherein a resistance of the second capping layer is lower than a resistance of the first capping layer.

6. The semiconductor integrated circuit device of claim 4, wherein the channel layer, the first capping layer and the second capping layer have different grain sizes.

7. The semiconductor integrated circuit device of claim 1, further comprising a memory layer interposed between the stack structure and the channel layer.

8. The semiconductor integrated circuit device of claim 1, further comprising a core pattern including an insulating material in the opening under the first capping layer.

9. The semiconductor integrated circuit device of claim 1, wherein impurities from the first capping layer were diffused into the second capping layer.

10. The semiconductor integrated circuit device of claim 1, wherein the second capping layer is seamless.

* * * * *